(12) United States Patent
Zhou et al.

(10) Patent No.: US 7,414,848 B2
(45) Date of Patent: Aug. 19, 2008

(54) HEAT DISSIPATION DEVICE

(75) Inventors: Shi-Wen Zhou, Shenzhen (CN); Peng Liu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/626,188

(22) Filed: Jan. 23, 2007

(65) Prior Publication Data

US 2008/0174964 A1 Jul. 24, 2008

(51) Int. Cl.
  *H05K 7/20* (2006.01)
  *F28D 15/00* (2006.01)

(52) U.S. Cl. .................. 361/704; 361/700; 361/703; 361/709; 361/710; 165/104.33; 165/185; 174/15.2; 174/16.3

(58) Field of Classification Search ................. 361/697, 361/699–704, 709–710; 165/80.3–80.5, 165/104.33, 185; 174/15.2, 16.3
See application file for complete search history.

(56) References Cited

U.S. PATENT DOCUMENTS

| | | | |
|---|---|---|---|
| 6,189,601 B1 * | 2/2001 | Goodman et al. .......... 165/80.3 |
| 6,917,522 B1 * | 7/2005 | Erturk et al. ................. 361/700 |
| 7,000,687 B2 | 2/2006 | Ying et al. | |
| 7,013,960 B2 | 3/2006 | Lee et al. | |
| 7,059,391 B2 | 6/2006 | Whitney | |
| 7,277,287 B2 * | 10/2007 | Chen et al. ................... 361/700 |
| 7,298,620 B2 * | 11/2007 | Wu ............................ 361/700 |
| 2006/0144572 A1 * | 7/2006 | Yu et al. ................. 165/104.33 |
| 2006/0273137 A1 * | 12/2006 | Chen et al. ................... 228/101 |
| 2007/0012428 A1 * | 1/2007 | Wu et al. ................ 165/104.33 |
| 2007/0047206 A1 * | 3/2007 | Lee et al. ..................... 361/703 |

* cited by examiner

*Primary Examiner*—Jayprakash N Gandhi
*Assistant Examiner*—Robert J Hoffberg
(74) *Attorney, Agent, or Firm*—Frank R. Niranjan

(57) ABSTRACT

A heat dissipation device includes a base and two heat sinks formed by aluminum extrusion and located on the base. Each heat sink includes a heat conducting portion. The two heat sinks include a plurality of first fins extending inwardly from first faces of the heat conducting portions and located between the heat conducting portions, and a plurality of second fins extending outwardly from second faces of the heat conducting portions. Two heat pipes connect the base and the two heat sinks. Each heat pipe includes a first section thermally engaged with the base, and two second sections extending from the base and thermally engaged with the heat conducting portion of a corresponding heat sink. The second sections are located outside a hub and below fan blades of an impeller of a fan mounted on the heat sinks.

12 Claims, 4 Drawing Sheets

HEAT DISSIPATION DEVICE

BACKGROUND OF THE INVENTION

1. Field of the Invention

The present invention relates generally to heat dissipation devices, and more particularly to a heat dissipation device used for dissipating heat generated by electronic devices.

2. Description of Related Art

It is well known that, during operation of a computer, electronic devices such as central processing units (CPUs) frequently generate large amounts of heat. The heat must be quickly removed from the electronic device to prevent it from becoming unstable or being damaged. Typically, a heat sink is attached to an outer surface of the electronic device to absorb heat from the electronic device. The heat absorbed by the heat sink is then dissipated to ambient air.

Conventional heat sinks formed by aluminum extrusion are widely used for dissipating heat of electronic devices. These conventional heat sinks each generally comprise a flat base and a plurality of fins integrally extending upwardly from the base. In use, the base contacts and absorbs heat from the electronic device. The heat in the base is transmitted to the fins to be dissipated to ambient air. However, the heat sink cannot quickly transfer the heat from the electronic device to a portion of the fins which is remote from the base. Therefore, the heat generated by the electronic device cannot be removed duly by the heat sink.

To solve the aforesaid drawback of the conventional heat sink, another kind of the heat sink has a T-shaped heat conducting body and a heat dissipating body thermally engaged with the heat conducting body. The heat dissipating body defines a through hole therein; the heat conducting body has an elongated portion thermally engaged in the hole of the heat dissipation body by soldering or by interferential means. However, the engagement of the heat conducting body and the heat dissipating body is fussy, and high heat resistance would be brought between the heat conducting body and the heat dissipating body, which adversely impacts heat dissipation capacity of the heat sink. Therefore, the heat sink should be improved to meet the heat dissipation requirement of the electronic device.

What is needed, therefore, is a heat dissipation device which can achieve a greater rate of heat dissipation for electronic devices in a computer enclosure.

SUMMARY OF THE INVENTION

A heat dissipation device in accordance with a preferred embodiment of the present invention comprises a base for absorbing heat from a heat generating device, and two aluminum-extruded heat sinks located on the base. Each heat sink comprises a heat conducting portion, a plurality of first fins extending from a first face of the heat conducting portions and located between the heat conducting portions of the two heat sinks, and a plurality of second fins extending from a second face of the heat conducting portions and located outside the heat conducting portions of the two heat sinks. Two heat pipes connect the base and the two heat sinks for transferring heat from the base to the two heat sinks. Each heat pipe comprises a first section thermally engaged with the base, and at least a second section extending away from the base and thermally engaged with the heat conducting portion of a corresponding heat sink. A fan is mounted on the heat sinks. The fan has an impeller with a hub and a plurality of fan blades extending outwardly and radially from the hub. The at least a second section of each of the heat pipes is located outside the hub and below the fan blades so that an airflow generated by the fan can effectively blow the second sections of the heat pipes to take heat away therefrom.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
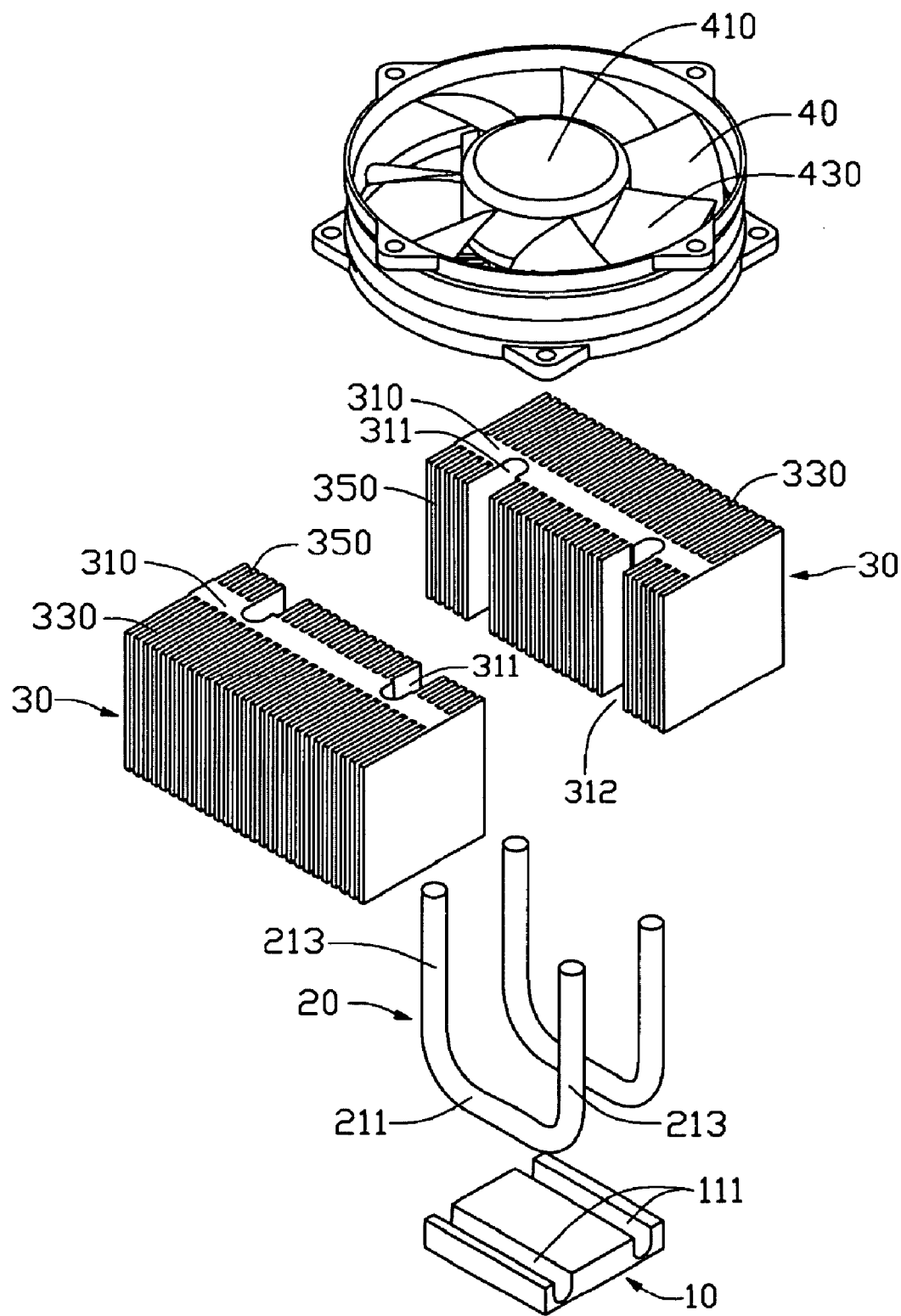
FIG. 1 is an exploded, isometric view of a heat dissipation device in accordance with a preferred embodiment of the present invention.
Figure 2:
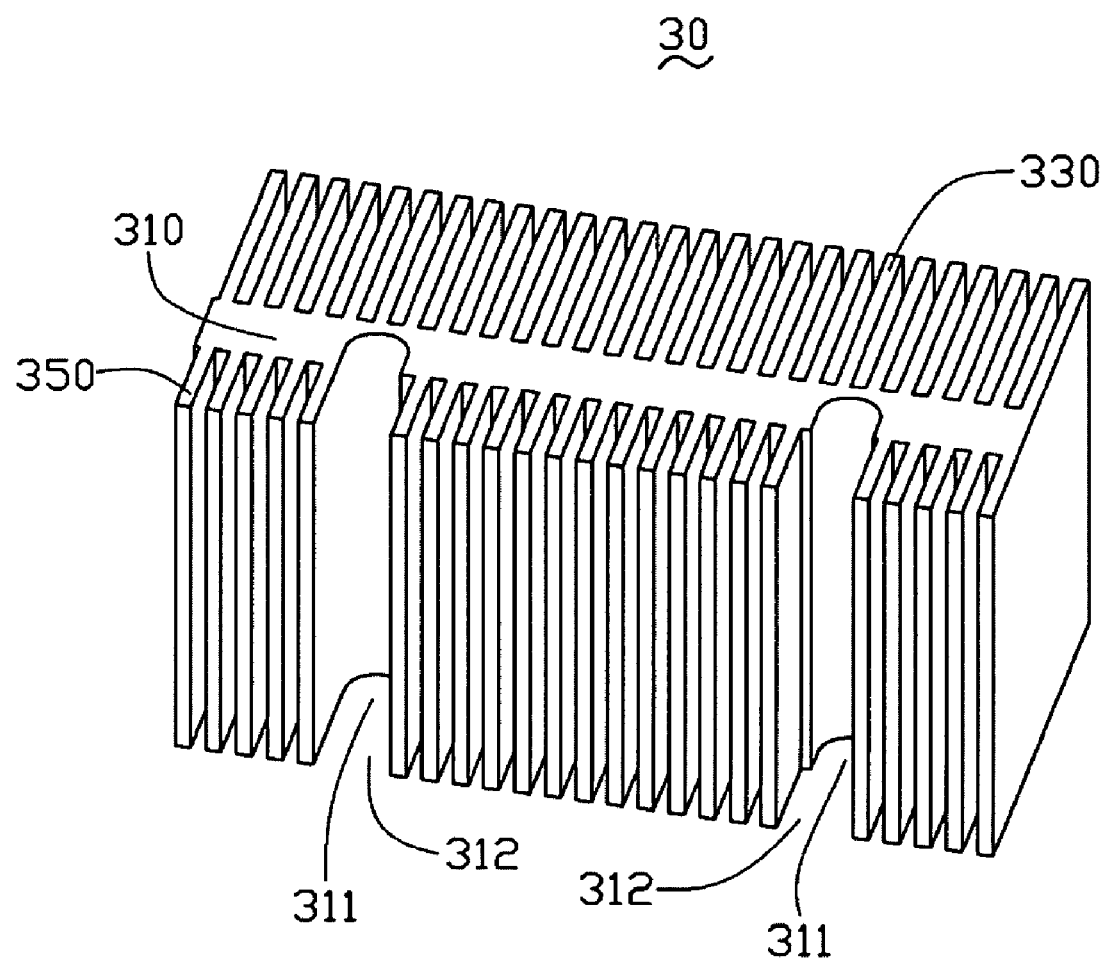
FIG. 2 shows a heat sink of the heat dissipation device of FIG. 1
Figure 3:
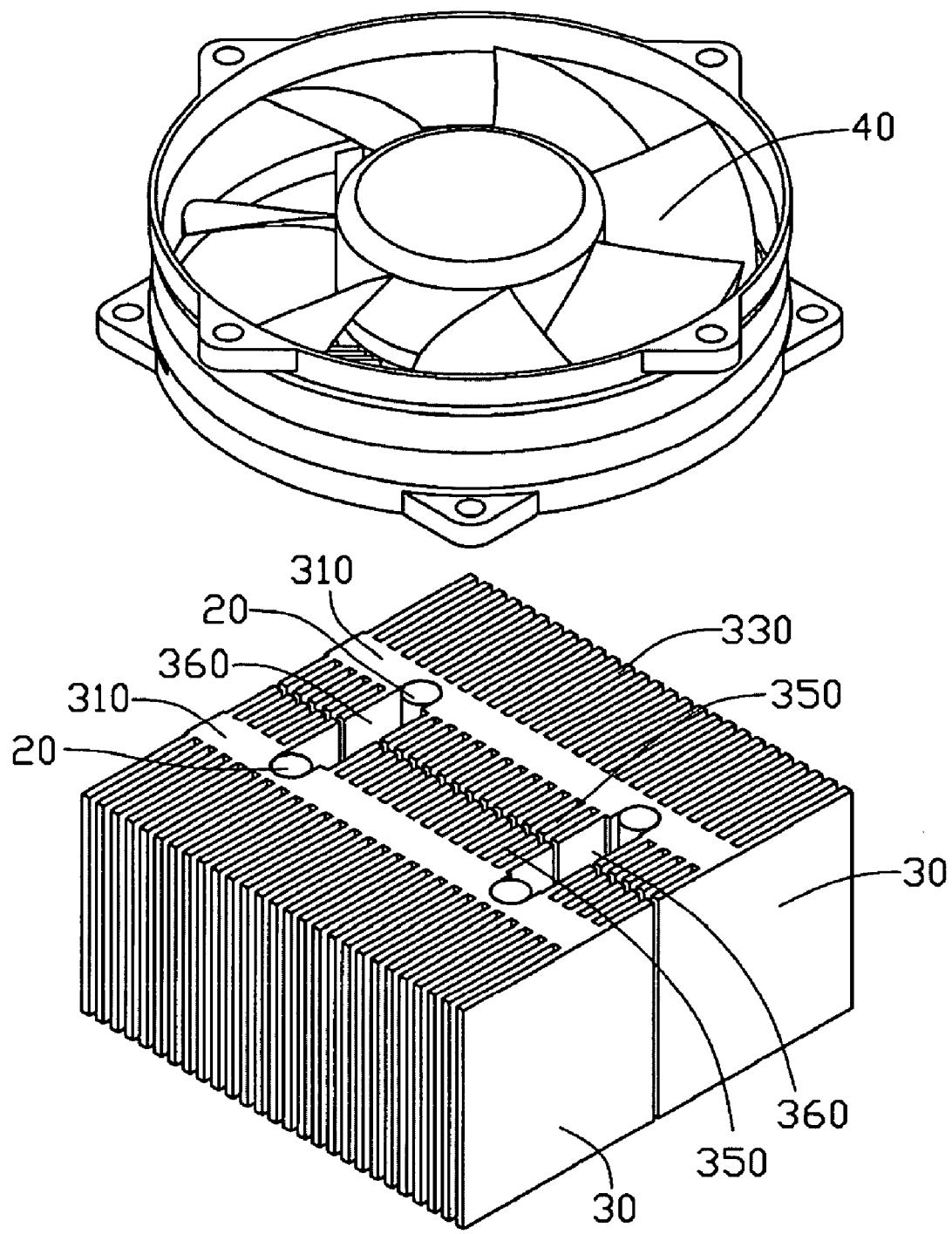
FIG. 3 is a partially assembled view of FIG. 1.
Figure 4:
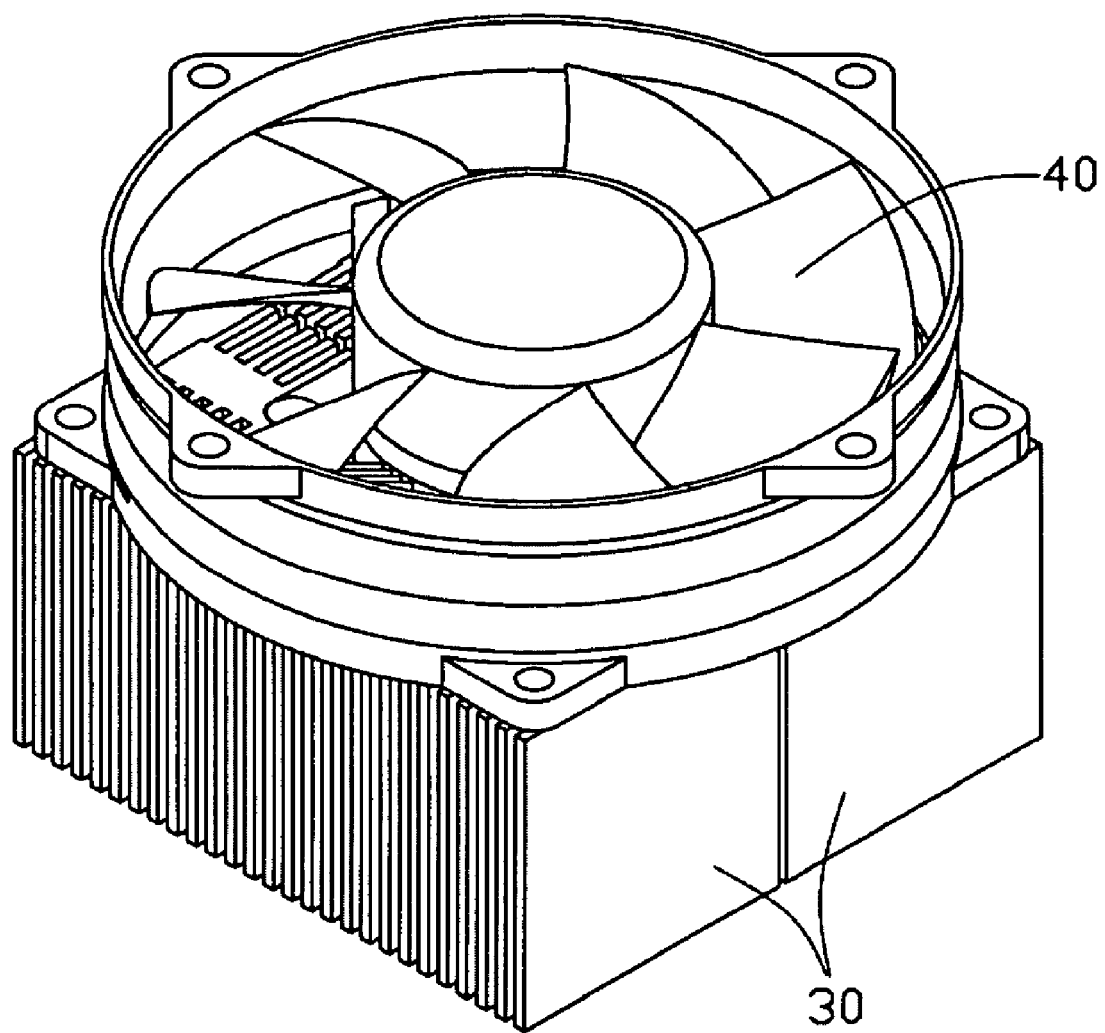
FIG. 4 is an assembled view of FIG. 3.

Referring to FIGS. 1-4, a heat dissipation device in accordance with a preferred embodiment of the invention is used for dissipating heat generated by an electronic device (not labeled). The heat dissipation device comprises a base 10, two heat pipes 20 thermally engaged with the base 10, two heat sinks 30 thermally engaged with the two heat pipes 20, and a fan 40 located atop the heat sinks 30 for providing forced airflow to the heat sinks 30, the heat pipes 20 and the base 10.

The base 10 is a rectangular metal plate having excellent heat conductivity. The base 10 has a flat bottom face for engaging with the electronic device and a top face defining two spaced parallel grooves 111 defined therein. The two grooves 111 are located adjacent to two opposite lateral portions of the base 10.

Each heat pipe 20 is substantially U-shaped in profile, and comprises a first transfer section 211, two parallel second transfer sections 213 perpendicularly extending from two ends of the first transfer section 211. A round corner is formed at each joint of the first, second transfer sections 211, 213 of each heat pipe 20.

Each heat sink 30 is extruded from an aluminum block, and comprises a vertical heat conducting portion 310 and a plurality of parallel first, second fins 330, 350 vertically extending from the heat conducting portion 310. The heat conducting portion 310 is substantially rectangular plate, and has a first lateral face (not labeled) and a second lateral face (not labeled) opposite to the first lateral face thereof. The first, second fins 330, 350 extend from the first, second lateral faces of the heat conducting portion 310 respectively. The second lateral face of the heat conducting portion 310 defines two spaced, parallel grooves 311 therein for receiving the two second transfer sections 213 of one of the two heat pipes 20 along a vertical direction. On the second lateral face of the heat conducting portion 310, there is no second fins 350 located corresponding to the grooves 311, thereby defining two slots 312 in communication with the corresponding grooves 311. The first fins 330 on the first lateral face are longer than the second fins 350 on the second lateral face of the heat conducting portion 310. A plurality of passages (not labeled) is defined between the first fins 330. A plurality of passages (not labeled) is defined between the second fins 350.

In assembly, the first transfer sections 211 of the two heat pipes 20 are thermally engaged in corresponding grooves 111 of the base 10. The second transfer sections 213 of the two heat pipes 20 extend perpendicularly and upwardly from the base 10. The two second transfer sections 213 of one of the two heat pipes 20 are thermally engaged in the two grooves 311 of one of the two heat sinks 30 along the vertical direction. The two second transfer sections 213 of the other of the two heat pipes 20 are thermally engaged in the two grooves 311 of the other of the two heat sinks 30 along the vertical direction. The second fins 350 of one heat sink 30 have distal ends thereof face to corresponding distal ends of the second fins 350 of the other heat sink 30. The corresponding slots 312 of the two heat sinks 30 in the second fins 350 define two channels 360 between the heat conducting portions 310 of the heat sinks 30. The two channels 360 each are located between two corresponding second transfer sections 213 of the two heat pipes 20. The two channels 360 extend from a top of the two heat sinks 30 to the base 10; therefore, the base 10 is exposed to the channels 360. The two heat sinks 30 are mirror image to each other when they are mounted to the base 10. The base 10 is located corresponding to a central portion of the two heat sinks 30 after the two heat sinks 30 are assembled together. The first fins 330 and lateral end portions of the second fins 350 of the two heat sinks 30 are located outside of the base 10. The fan 40 faces the passages and the channels 360 of the two heat sinks 30 and is fixed on the top of the heat sinks 30.

In use, the bottom face of the base 10 contacts and absorbs heat from the electronic device. The heat in the base 10 is absorbed by the first transfer sections 211 of the two heat pipes 20 and then is transmitted to the corresponding heat conducting portions 310 of the two heat sinks 30 via the corresponding second transfer sections 213 of the two heat pipes 20. The heat in the heat conducting portions 310 spreads to the first, second fins 330, 350 of the two heat sinks 30. The fan 40 provides forced airflow to the two heat sinks 30. Part airflow passes through the passages between the fins 330, 350 of the two heat sinks 30 and removes the heat in the first, second fins 330, 350. Part airflow flows to the base 10 after passing through the passages and the channels 360 of the two heat sinks 30 and directly removes the heat from the base 10.

In the present invention, the fan 40 has an impeller (not labeled) for generated the forced airflow when the impeller rotates. The impeller has a central hub 410 and a plurality of fan blades 430 extending radially and outwardly from the central hub. The second transfer sections 213 of the heat pipes 20 are located outside the hub and below the fan blades whereby when the force airflow can effectively blow the heat pipes 20 to take heat away therefrom.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a base;
   two extruded heat sinks located on the base, each heat sink comprising a heat conducting portion and a plurality of fins extending from two faces of the heat conducting portion;
   two heat pipes for transferring heat from the base to the two heat sinks, each heat pipe having a first section thermally engaged with the base, and at least a second section extending upwardly from the base and thermally engaged with a corresponding heat conducting portion of one of the two heat sinks;
   wherein the fins of each of the two heat sinks comprises a plurality of first fins extending from a first face of the heat conducting portion of a corresponding heat sink, and a plurality of second fins extending from a second face opposite to the first face of the heat conducting portion;
   wherein the heat conducting portion of each of the two heat sinks defines at least a groove receiving corresponding the at least a second section of one of the two heat pipes; and
   wherein each of the two heat sinks defines at least a slot in the second fins thereof, the at least a slot being in communication with the at least a groove of the heat conducting portion of each of the two heat sinks.

2. The heat dissipation device of claim 1, wherein the first fins of each of the two heat sinks are parallel to each other.

3. The heat dissipation device of claim 1, wherein the second fins of each of the two heat sinks are parallel to each other.

4. The heat dissipation device of claim 1, wherein the first fins are longer than the second fins of the two heat sinks.

5. The heat dissipation device of claim 1, wherein the second fins of one of the two heat sinks face to corresponding distal ends of the second fins of the other of the two heat sinks, and the at least a slot of each of the two heat sinks cooperatively defines at least a channel extending from a top of the two heat sinks to the base.

6. The heat dissipation device of claim 5, wherein the two heat pipes each are substantially U-shaped in profile, and comprises two aforesaid second sections thermally engaged with the heat conducting portion of the corresponding heat sink.

7. The heat dissipation device of claim 5, further comprising a fan mounted on the top of the two heat sinks, the fan facing the at least a channel of the heat sinks, the fan having a hub and a plurality of fan blades extending outwardly and radially from the hub, the at least a second section of the each heat pipe being located outside the hub and below the fan blades.

8. A heat dissipation device comprising:
   a base;
   two heat sinks located on the base, each heat sink comprising a heat conducting portion, the two heat sinks comprising a plurality of first fins extending from the heat conducting portions and located between the heat conducting portions of the two heat sinks, a plurality of second fins extending from the heat conducting portions and located outside the heat conducting portions of the two heat sinks; and
   two heat pipes each having a first section thermally engaged with the base, and at least a second section extending from the base and thermally engaged with the heat conducting portion of a corresponding heat sink;
   wherein the second sections of the two heat pipes are located between the two heat conducting portions of the two heat sinks; and
   wherein the two heat sinks define at least a channel between the second sections of the two heat pipes.

9. The heat dissipation device of claim 8, wherein the at least a channel extends from a top side of the two heat sinks to the base, and the base is exposed to the at least a channel.

10. The heat dissipation device of claim 8, wherein the second sections of the two heat pipes are exposed to the at least a channel.

11. The heat dissipation device of claim 8, wherein the first fins are parallel to each other, and extend from a first face of the heat conducting portion, and wherein the second fins are parallel to each other, and extend from a second face opposite to the first face of the heat conducting portion of each of the heat sinks.

12. The heat dissipation device of claim 8 further comprising a fan mounted on the heat sinks, the fan having a hub and a plurality of fan blades extending radially and outwardly from the hub, the second sections of the heat pipes being located outside the hub and below the fan blades so that an airflow generated by the fan can effectively blow the second sections of the heat pipes.

* * * * *